(12) United States Patent
Ando et al.

(10) Patent No.: US 10,893,625 B2
(45) Date of Patent: Jan. 12, 2021

(54) ELECTRONIC MACHINE

(71) Applicant: Mitsubishi Electric Corporation, Tokyo (JP)

(72) Inventors: Yuji Ando, Tokyo (JP); Chiharu Miyazaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/605,679

(22) PCT Filed: May 22, 2017

(86) PCT No.: PCT/JP2017/019044
§ 371 (c)(1),
(2) Date: Oct. 16, 2019

(87) PCT Pub. No.: WO2018/216073
PCT Pub. Date: Nov. 29, 2018

(65) Prior Publication Data
US 2020/0120824 A1    Apr. 16, 2020

(51) Int. Cl.
*H05K 7/00* (2006.01)
*H05K 7/14* (2006.01)
*H05K 9/00* (2006.01)

(52) U.S. Cl.
CPC ......... *H05K 7/1427* (2013.01); *H05K 9/0007* (2013.01)

(58) Field of Classification Search
None
See application file for complete search history.

(56) References Cited

U.S. PATENT DOCUMENTS 5,381,314 A * 1/1995 Rudy, Jr. .............. H05K 7/1449
257/729
5,737,194 A * 4/1998 Hopkins .............. H05K 7/1461
361/728

(Continued)

FOREIGN PATENT DOCUMENTS

JP        7-38272 A    2/1995
JP    2000-49485 A    2/2000

(Continued)

OTHER PUBLICATIONS

International Search Report issued in PCT/JP2017/019044 (PCT/ISA/210), dated Aug. 22, 2017.

(Continued)

*Primary Examiner* — Courtney L Smith
*Assistant Examiner* — Rashen E Morrison
(74) *Attorney, Agent, or Firm* — Birch, Stewart, Kolasch & Birch, LLP

(57) ABSTRACT

A plurality of electronic circuit boards (2), on which electronic components are mounted, is inserted in parallel through an electronic circuit insertion port (11) of a casing body (1). A gap (3) is formed between front panels (22) of inserted and adjacent electronic circuit boards (2) inserted. A bridge body (5) constituting conduction means electrically conducts a first conductive side portion (22a) of a front panel (22) in one electronic circuit board (2) of adjacent electronic circuit boards (2) and a second conductive side portion (22b) of a front panel (22) in another electronic circuit board (2) that faces the first conductive side portion (22a) via a gap (3).

10 Claims, 6 Drawing Sheets

(56) References Cited

U.S. PATENT DOCUMENTS

| | | | | |
|---|---|---|---|---|
| 8,107,256 | B1* | 1/2012 | Kondrat | H05K 7/1429 |
| | | | | 361/796 |
| 8,920,185 | B2* | 12/2014 | Pai | H01R 13/62 |
| | | | | 439/345 |
| 10,779,433 | B2* | 9/2020 | Abs | H03F 3/602 |
| 2018/0364765 | A1* | 12/2018 | Kitamura | G06F 1/1662 |

FOREIGN PATENT DOCUMENTS

| | | | |
|---|---|---|---|
| JP | 2001-267776 | A | 9/2001 |
| JP | 2001-320189 | A | 11/2001 |
| JP | 2002-141684 | A | 5/2002 |
| JP | 2003-23276 | A | 1/2003 |
| JP | 2004-111613 | A | 4/2004 |
| JP | 4062602 | B2 | 3/2008 |

OTHER PUBLICATIONS

Notice of Reasons for Refusal, Office Action for Japanese Application No. 2017-554613, dated Feb. 6, 2018.

German Office Action dated May 8, 2020 in corresponding German Patent Application No. 11 2017 007 453.3 with an English Translation.

* cited by examiner

Front View

Top View

Front View

Top View

Front View

Top View

ELECTRONIC MACHINE

TECHNICAL FIELD

The present invention relates to an electronic machine in which a plurality of electronic circuit boards each having a circuit board, on which a plurality of electronic components is mounted, and a front panel connected to this circuit board is housed in parallel in a casing body, and particularly relates to an electronic machine capable of suppressing noise radiated from the electronic machine.

BACKGROUND ART

In an electronic machine in which a plurality of electronic circuit boards each having a circuit board, on which a plurality of electronic components is mounted, and a front panel connected to this circuit board is housed in parallel in a casing body, a clock frequency used becomes a higher frequency. Analog and digital signals operating at high frequencies become a cause of radiated noise and cause other electronic machines to malfunction. From this, as a method of suppressing noise radiated from an electronic machine, one shown in Patent Literature 1 is proposed.

In other words, on front surfaces of front panels of a plurality of electronic circuit boards, a metal bar is provided so as to straddle gaps between the front panels adjacent to each other. This metal bar controls a frequency of noise from an electronic component radiated from the inside of a casing body to outside space through the gaps.

Also, one or three metal bars disposed perpendicularly to the gaps, one metal bar slidably provided on the casing body, and one metal bar disposed obliquely to the gaps are shown.

CITATION LIST

Patent Literatures

Patent Literature 1: JP 4062602 B2

SUMMARY OF INVENTION

Technical Problem

However, in the electronic machine disclosed in Patent Literature 1, the metal bar and the front panels are not electrically connected, and a noise suppression effect is not sufficient.

Also, as in recent years, when the clock frequency used becomes a high frequency, in order to suppress noise based on the high frequency, it is necessary to cover many areas on a front surface of the casing body with the metal bar from a left end to a right end of the casing body, and there is a problem that operation of a control panel becomes difficult.

The present invention is made in view of the above-mentioned point, and a purpose of the present invention is to obtain an electronic machine that can suppress noise based on a high frequency by setting a resonance frequency in a casing body higher, and can implement a noise countermeasure at a portion of a front surface of the casing body where the noise countermeasure is desired to be taken.

Solution to Problem

In an electronic machine according to the present invention, a plurality of electronic circuit boards, on which electronic components are mounted, is inserted and housed in parallel through one surface of a casing body with gaps between front panels adjacent to each other. The electronic machine is provided with conduction means having a bridge body for electrically conducting a first conductive side portion of a front panel in one electronic circuit board of electronic circuit boards adjacent to each other and a second conductive side portion of a front panel in another electronic circuit board that faces the first conductive side portion via a gap, wherein each of the plurality of electronic circuit boards has a plurality of engagement portions on the first conductive side portion and the second conductive side portion along the longitudinal direction, the conduction means has a plurality of first bridge bodies, and each of the first bridge bodies is a conductive plate having: one end screwed to a selected engagement portion of a plurality of engagement portions provided on the first conductive side portion of the front panel in one electronic circuit board of electronic circuit boards adjacent to each other and another end screwed to a selected engagement portion of a plurality of engagement portions provided on the second conductive side portion of the front panel in another electronic circuit board.

Advantageous Effects of Invention

According to the present invention, the front panels of the electronic circuit boards adjacent to each other can be conducted at arbitrary positions by the bridge body, a resonance frequency of the casing body can be set higher, and even when a clock frequency used in the electronic circuit boards is high, there is an effect that noise can be suppressed.

DESCRIPTION OF EMBODIMENTS

First Embodiment

Figure 1:
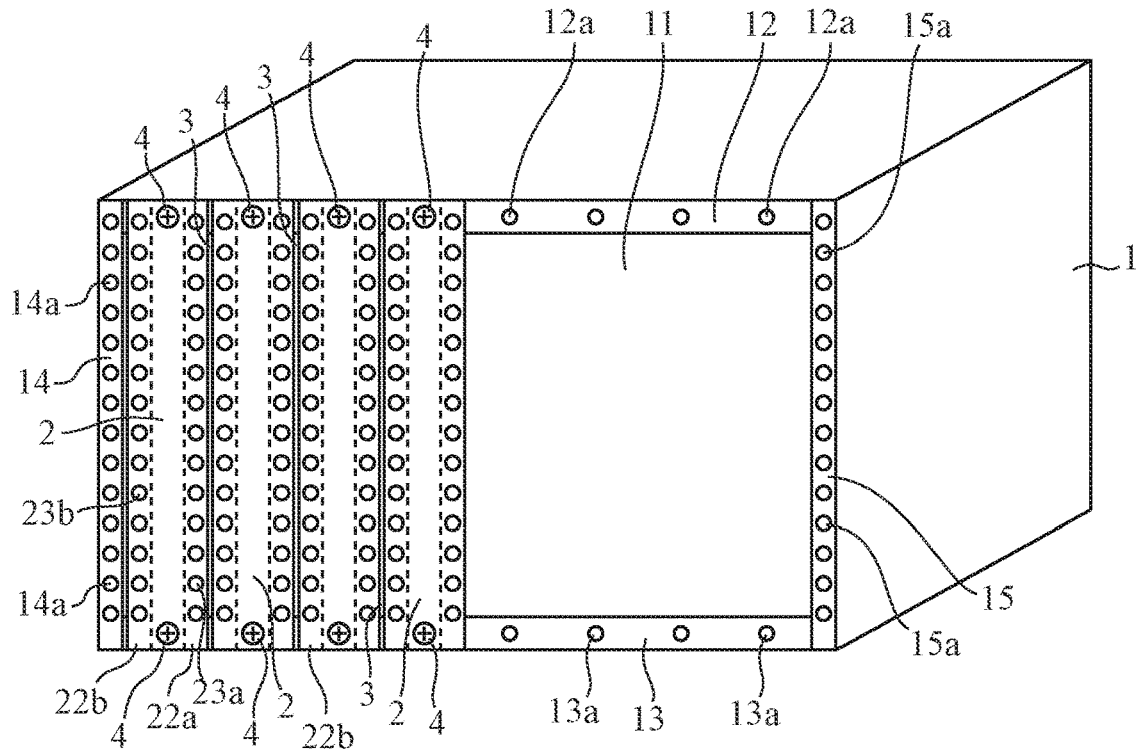
FIG. 1 is a perspective view showing an essential part of an electronic machine according to a first embodiment of the present invention, with some of electronic circuit boards being removed from it before first to third bridge bodies 5 and 7 are mounted.

A first embodiment of the present invention will be described below with reference to FIGS. 1 to 3.

A casing body 1 has an electronic circuit board insertion port 11 on a front surface which is one surface. At an upper end of the electronic circuit board insertion port 11 in the casing body 1, there is an upper edge 12 extended from an upper surface and bent 90 degrees toward the electronic circuit board insertion port 11. A plurality of screw holes 12a is formed at the upper edge 12 at equal intervals along a horizontal direction. The plurality of screw holes 12a serves as upper part attachment portions for attaching electronic circuit boards 2. The plurality of screw holes 12a is disposed corresponding to the plurality of electronic circuit boards 2 inserted in parallel through the electronic circuit board insertion port 11 of the casing body 1 with gaps 3 between front panels 22 adjacent to each other.

At a lower end of the electronic circuit board insertion port 11 in the casing body 1, there is a lower edge 13 extended from a lower surface and bent 90 degrees toward the electronic circuit board insertion port 11. A plurality of screw holes 13a is formed at the lower edge 13 at equal intervals along the horizontal direction. The plurality of screw holes 13a serves as lower attachment portions for attaching the electronic circuit boards 2. The plurality of screw holes 13a is disposed corresponding to the plurality of electronic circuit boards 2 inserted in parallel through the electronic circuit board insertion port 11 of the casing body 1 with the gaps 3 between the front panels 22 adjacent to each other.

In the first embodiment, the upper edge 12 and the lower edge 13 are made of metal.

On a left side of the electronic circuit board insertion port 11 in the casing body 1, there is a left conductive portion 14 extended from a left side surface and bent 90 degrees toward the electronic circuit board insertion port 11. A plurality of holes 14a is formed in the left conductive portion 14 at equal intervals along a vertical direction. The plurality of holes 14a is internally threaded. The internally-threaded holes 14a are engagement portions.

On a right side of the electronic circuit board insertion port 11 in the casing body 1, there is a right conductive unit 15 extended from a right side surface and bent 90 degrees toward the electronic circuit board insertion port 11. A plurality of holes 15a is formed in the right conductive portion 15 at equal intervals along the vertical direction. The plurality of holes 15a is internally threaded. The internally-threaded holes 15a are engagement portions. The holes 14a and the holes 15a are formed in the same number, and the hole 14a and the hole 15a located in each step are at the same height.

In the first embodiment, the left conductive portion 14 and the right conductive portion 15 are made of metal.

Note that it is preferable that the upper edge 12, the lower edge 13, the left conductive portion 14, and the right conductive portion 15 in the casing body 1 be grounded.

Figure 2:
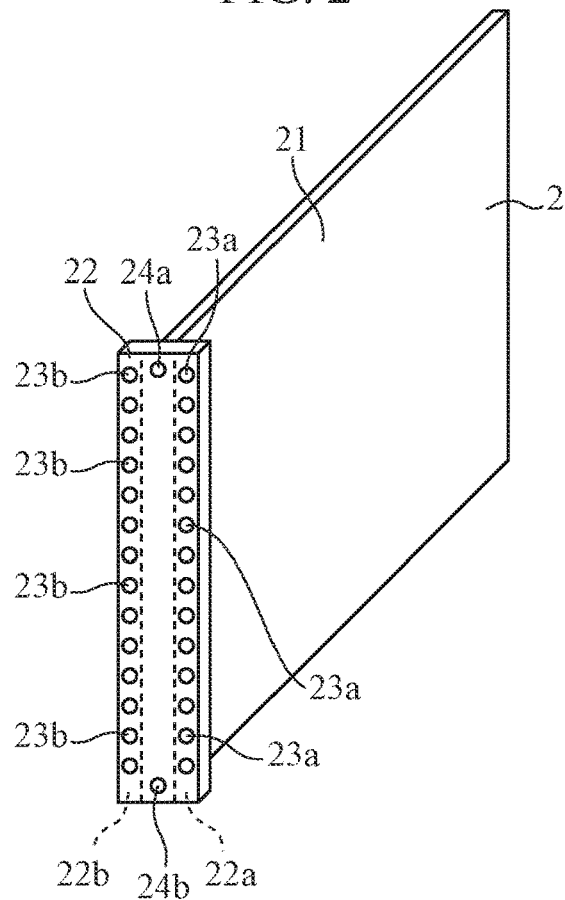
FIG. 2 is a schematic perspective view showing an electronic circuit board 2 in the electronic machine according to the first embodiment of the present invention.

The electronic circuit board 2 is generally formed in a T shape as shown in FIG. 2. A leg of the T shape is a circuit board 21 on which electronic components are mounted. A head of the T shape attached to be connected to the circuit board 21 is a front panel 22. Note that the shape of the electronic circuit board 2 is not limited to the T shape and may be an L shape.

The front panel 22 has a first conductive side portion 22a and a second conductive side portion 22b opposite to the first conductive side portion 22a, which are a pair of electrically conductive longitudinal sides. The first conductive side portion 22a and the second conductive side 22b portion are made of a conductor. In the first embodiment, the front panel 22 is made of metal, and the first conductive side 2 portion 2a and the second conductive side 22b portion form parts of the front panel 22.

A plurality of holes 23a is formed on the first conductive side portion 22a at equal intervals along the vertical direction. The plurality of holes 23a is internally threaded. The internally-threaded holes 23a are engagement portions. A plurality of holes 23b is formed on the second conductive side portion 22b at equal intervals along the vertical direction. The plurality of holes 23b is internally threaded. The internally-threaded holes 23b are engagement portions.

The holes 23a and the holes 23b are formed in the same number, and the hole 14a and the hole 15a located in each step formed in the left conductive portion 14 and the right conductive portion 15 are at the same height. Further, the holes 14a and the holes 15a have the same number, and when the electronic circuit board 2 is inserted through the electronic circuit board insertion port 11 of the casing body 1 and is fixed, the hole 23a and the hole 23b and the hole 14a and the hole 15a located in each step are at the same height.

An upper part attachment portion 24a consisting of a through hole is formed at an upper end of the front panel 22 of the electronic circuit board 2, and a lower part attachment portion 24b consisting of a through hole is formed at a lower end thereof.

In the electronic circuit board 2, the upper part attachment portion 24a is positioned at a corresponding screw hole 12a at the upper edge 12 of the casing body 1, the lower part attachment portion 24b is positioned at a corresponding screw hole 13a at the lower edge 13 of the casing body 1, and then, the circuit board 21 of the electronic circuit board 2 is inserted through the electronic circuit board insertion port 11 of the casing body 1. In the inserted electronic circuit board 2, a screw 4 passes through the upper part attachment portion 24a of the front panel 22 and is screwed into the corresponding screw hole 12a at the upper edge 12 of the casing body 1, and then, its upper part is fixed to the casing body 1. Further, in the inserted electronic circuit board 2, a screw 4 passes through the lower part attachment portion 24b of the front panel 22 and is screwed into the corresponding screw hole 13a at the lower edge 13 of the casing body 1, and then, its lower part is fixed to the casing body 1.

Since the metal front panel 22 is fixed in contact with the metal upper edge 12 and lower edge 13 of the casing body 1, electrical conduction is achieved. When potential of the upper edge 12 and the lower edge 13 is set to ground potential, the front panel 22 also has the ground potential, and the first conductive side portion 22a and the second conductive side portion 22b also have the ground potential.

Note that, though the front panel 22 is fixed to the front surface of the casing body 1 by the screws 4 through the through holes and the screw holes, the present invention is not limited to this. It may be fixed by dedicated jigs attached to the upper part and the lower part of the front panel 22.

In this manner, the plurality of electronic circuit boards 2 is inserted in parallel through the electronic circuit board insertion port 11 of the casing body 1 with the linear gaps 3 between the front panels 22 adjacent to each other, and the circuit boards 21 are removably housed inside the casing body 1.

Figure 3:
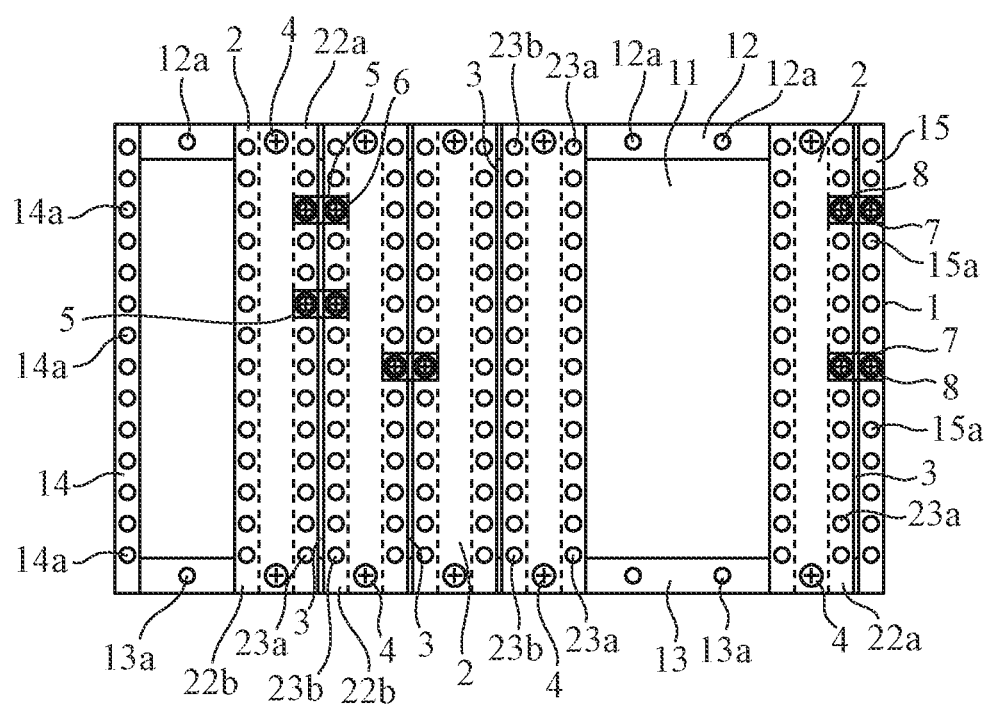
FIG. 3 is a front view of the essential part showing the electronic machine according to the first embodiment of the present invention, in which some of the electronic circuit boards 2 after mounting the first to third bridge bodies 5, 7 and the third bridge body are removed.

As shown in FIG. 3, conduction means has a first bridge body 5 for electrically conducting a first conductive side portion 22a of a front panel 22 in one electronic circuit board 2 of electronic circuit boards 2 adjacent to each other and a second conductive side portion 22b of a front panel 22 in another electronic circuit board 2 thereof that faces the first conductive side portion 22a through a gap 3. The first bridge body 5 is a flat metal plate having through holes, through which screws 6 pass, at both ends.

There is a plurality of first bridge bodies 5 of the conduction means. In the first bridge body 5, a through hole provided at one end is disposed in an internal thread which is a selected engagement portion 23a of the plurality of engagement portions 23a provided on the first conductive side portion 22a of the front panel 22 in the one electronic circuit board 2 of the electronic circuit boards 2 adjacent to each other. The screw 6 is passed through this through hole and screwed to the internal thread which is the engagement portion 23a. A through hole provided at another end is disposed in an internal thread which is a selected engagement portion 23b of the plurality of engagement portions 23b provided on the second conductive side portion 22b of the front panel 22 in the other electronic circuit board 2. The screw 6 is passed through this through hole and screwed to the internal thread which is the engagement portion 23b.

In each of the first bridge bodies 5, the selected engagement portion 23a of the plurality of engagement portions 23a provided on the first conductive side portion 22a and the selected engagement portion 23b of the plurality of engagement portions 23b provided on the second conductive side portion 22b, to both of which the first bridge body 5 is attached, have the same height.

As a result, the first bridge body 5 electrically conducts the first conductive side portion 22a of the front panel 22 in the one electronic circuit board 2 of the electronic circuit boards 2 adjacent to each other and the second conductive side portion 22b of the front panel 22 in the other electronic circuit board 2 that faces the first conductive side portion 22a via the gap 3.

Therefore, compared to a case where the first bridge body 5 straddling the gap 3 is not mounted, when the first bridge body 5 is mounted, a height of the gap 3 is substantially reduced, and a resonance frequency in this gap portion is made high. Therefore, even when a clock frequency used for the electronic circuit board 2 located in the gap 3 is high, the resonance frequency in the gap portion can be made higher than the clock frequency, and noise based on the clock frequency can be suppressed.

For example, assuming that the height of the gap 3 is H, the gap 3 functions as an antenna, and a resonance frequency in the gap 3 is fn=c/(2H) (c is speed of light). However, when the first bridge body 5 is provided at the center in a height direction with respect to the third and fourth electronic circuit boards 2 from the left shown in FIG. 3, the height of the gap 3 becomes substantially (½)H with respect to resonance, and a resonance frequency fn in the gap 3 is doubled compared to fn. When a specific frequency subject to noise interference is fn in a peripheral device, since the specific frequency fn radiated from the gap 3 to external space can be suppressed and noise is significantly suppressed, the peripheral device is less susceptible to the noise interference.

As shown in FIG. 3, the conduction means has a second bridge body 7 for electrically conducting a first conductive side portion 22a of a front panel 22 in an electronic circuit board 2 disposed at a right end and the right conductive portion 15 of the casing body 1 that faces the first conductive side portion 22a via the gap 3. The second bridge body 7 is the same as the first bridge body 5 and is a flat metal plate having through holes, through which screws 8 pass, at both ends.

There is a plurality of second bridge bodies 7 of the conduction means. In the second bridge body 7, a through hole provided at one end is disposed in an internal thread which is a selected engagement portion 23a of the plurality of engagement portions 23a provided on the first conductive side portion 22a of the front panel 22 in the electronic circuit board 2 disposed at the right end. The screw 8 is passed through this through hole and screwed to the internal thread which is the engagement portion 23a. A through hole provided at another end is disposed in an internal thread which is a selected engagement portion 15a of the plurality of engagement portions 15a provided in the right conductive portion 15 of the casing body 1. The screw 8 is passed through this through hole and screwed to the internal thread which is the engagement portion 15a.

In each of the second bridge bodies 7, the selected engagement portion 23a of the plurality of engagement portions 23a provided on the first conductive side portion 22a and the selected engagement portion 15a of the plurality of engagement portions 15a provided on the right conductive portion 15, to both of which the second bridge body 7 is attached, have the same height.

As a result, the second bridge body 7 electrically conducts the first conductive side portion 22a of the front panel 22 in the electronic circuit board 2 disposed at the right end and the right conductive portion 15 of the casing body 1 that faces the first conductive side portion 22a with the gap 3 interposed therebetween.

Therefore, compared to a case where the second bridge body 7 extending over the gap 3 is not mounted, when the second bridge body 7 is mounted, a height of the gap 3 is substantially reduced, and a resonance frequency in this gap portion is made high. Therefore, even when a clock frequency used for the electronic circuit board 2 disposed at the right end is high, the resonance frequency in the gap 3 portion can be made higher than the clock frequency, and noise based on the clock frequency can be suppressed.

Although an electronic circuit board 2 disposed at a left end is omitted in FIG. 3, as described in the electronic circuit board 2 disposed at the right end, a third bridge body for electrically conducting a second conductive side portion 22b of a front panel 22 in the electronic circuit board 2 disposed at the left end and the left conductive portion 14 of the casing body 1 that faces the second conductive side portion 22b with the gap 3 interposed therebetween is provided.

Also in this case, as described in the electronic circuit board 2 disposed at the right end, even when a clock frequency used for the electronic circuit board 2 disposed at the left end is high, a resonance frequency in the gap 3 portion can be made higher than the clock frequency, and noise based on the clock frequency can be suppressed.

In the first embodiment, FIG. 3 shows two first bridge bodies 5 straddling the gap 3 between the front panels 22 of the second and third electronic circuit boards 2 from the left, one first bridge body 5 straddling the gap 3 between the front panels 22 of the third and fourth electronic circuit boards 2 from the left, and two second bridge bodies 7 straddling the gap 3 between the front panel 22 of the electronic circuit board 2 disposed at the right end and the right conductive portion 15 of the casing body 1. However, the number of first bridge bodies 5 and second bridge bodies 7 is not limited thereto.

In short, the first bridge body 5 to the third bridge body may be disposed at locations necessary to prevent the high frequency radiated from the electronic machine from becoming an interfering wave.

Next, a method of mounting the first bridge body 5 to the third bridge body will be described on the basis of FIGS. 1, 3, and 4. Note that, though the third bridge body is not shown, the method and an idea of mounting are the same as those of the first bridge body 5 and the second bridge body 7.

Figure 4:
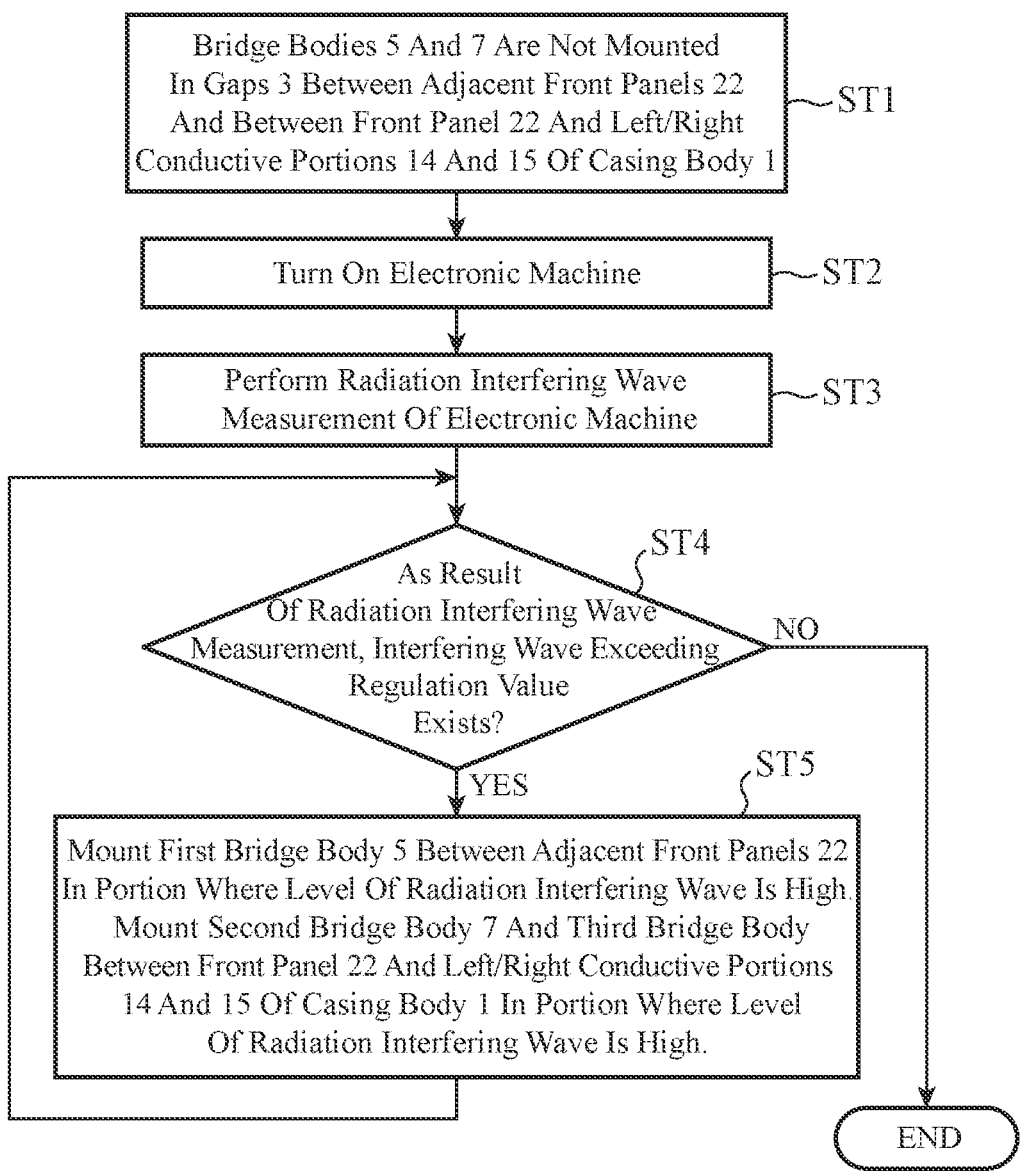
FIG. 4 is a flowchart for implementing a countermeasure against a radiation interfering wave of the electronic machine according to the first embodiment of the present invention.

First, as shown in step ST1 in FIG. 4, the first bridge body 5 is not mounted on the gap 3 between the front panels 22 adjacent to each other, and the second bridge body 7 and the third bridge body are not mounted on the gaps 3 between the front panels 22 and the left conductive portion 14 and the right conductive portion 15 of the casing body 1.

In other words, as shown in FIG. 1, the plurality of electronic circuit boards 2 is inserted in parallel through the electronic circuit board insertion port 11 of the casing body 1 with the gaps 3 between the front panels adjacent to each other, and each of the plurality of electronic circuit boards 2 is fixed to the casing body 1 at the upper part and the lower part by the screws 4.

This state is a substantially completed state as the electronic machine.

Next, in step ST2, the electronic machine is powered on and operated.

In step ST3, radiation interfering wave measurement is performed. At this time, as shown in step ST4, as a result of the radiation interfering wave measurement, it is determined whether there is a radiation interfering wave exceeding a regulation value. If the radiation interfering wave exceeding the regulation value is not measured, it is not necessary to mount the first bridge body 5 to the third bridge body, and the process ends. For example, as shown in FIG. 3, since a radiation interfering wave exceeding the regulation value is not measured from the gap 3 between the third electronic circuit board 2 and the fourth electronic circuit board 2 from the left in the figure, the first bridge body 5 is not mounted between the front panels 22 of the third electronic circuit board 2 and the fourth electronic circuit board 2.

Note that, as described above, the radiation interfering wave is noise having a specific frequency at which a peripheral device suffers from noise interference. However, it is not limited to this noise.

As a result of the radiation interfering wave measurement in step ST4, if there is a radiation interfering wave exceeding the regulation value, in step ST5, as shown in FIG. 3, the first bridge body 5, the second bridge body 7, and the third bridge body are mounted so as straddle the gaps 3 where a noise countermeasure is desired to be taken. In other words, the first bridge body 5 is mounted between the front panels 22 adjacent to each other in a portion where a level of the radiation interfering wave is high, and the second bridge body 7 and the third bridge body are respectively mounted between the front panel 22 and the right conductive portion 15, and between the front panel 22 and the left conductive portion 14 of the casing body 1 in a portion where a level of the radiation interfering wave is high. Specifically, the first bridge body 5 is disposed at the selected engagement portions 23a and 23b of the front panels 22 in the electronic circuit boards 2 adjacent to each other with respect to the gap 3 where the noise countermeasure is desired to be carried out, and is screwed by the screws 6. The second bridge body 7 and the third bridge body are also mounted in the same manner as the first bridge body 5.

FIG. 3 shows, as an example, two first bridge bodies 5 straddling the gap 3 between the front panels 22 of the second and third electronic circuit boards 2 from the left, one first bridge body 5 straddling the gap 3 between the front panels 22 of the third and fourth electronic circuit boards 2 from the left, and two second bridge bodies 7 straddling the gap 3 between the front panel 22 of the electronic circuit board 2 disposed at the right end and the right conductive portion 15 of the casing body 1.

Positions of the first bridge body 5, the second bridge body 7, and the third bridge body are determined as follows.

Suppose that a frequency of the radiation interfering wave is fx and a height of the gap 3 is H. Resonance is generated at a wavelength λ☐2H in the gap 3, that is, at a frequency fn=c/(2H) (c is speed of light). When the resonance frequency fn is the same as the frequency fx and the clock frequency used in the electronic circuit boards 2 adjacent to each other for the gap 3 is the same as the resonance frequency fn, noise based on the clock frequency is emphasized and radiated from the gap 3. The radiated noise is a radiation interfering wave and exceeds the regulation value.

Therefore, in order to suppress radiation of the noise based on the clock frequency in the gap 3, a height of the first bridge body 5 placed in the gap 3 is selected so that the resonance frequency f becomes sufficiently high with respect to the frequency fx, for example, f=2fx. In order to double the resonance frequency fn the gap 3 with respect to fn, the first bridge body 5 should be disposed at the center of the gap 3 and fixed to the front panels 22 of the electronic circuit board 2 adjacent to each other, thereby bringing the two front panels 22 into an electric conduction state.

The second bridge body 7 and the third bridge body are also positioned in the same manner as the first bridge body 5.

As described above, in the first embodiment, the front panels 22 of the electronic circuit boards 2 adjacent to each other can be conducted by the bridge body 5, 7 as the conduction means at an arbitrary position in a portion where the noise countermeasure is desired to be taken. As a result, a resonance frequency of the casing body 1 can be set higher.

Therefore, in the first embodiment, even when the clock frequency used in the electronic circuit board 2 is high, noise can be suppressed. Furthermore, the resonance frequency in the gap between the front panels 22 of the electronic circuit boards 2 adjacent to each other can be set to a desired value, and an attenuation amount of the noise emitted from the electronic machine can also be set to a desired value.

Second Embodiment

Figure 5:
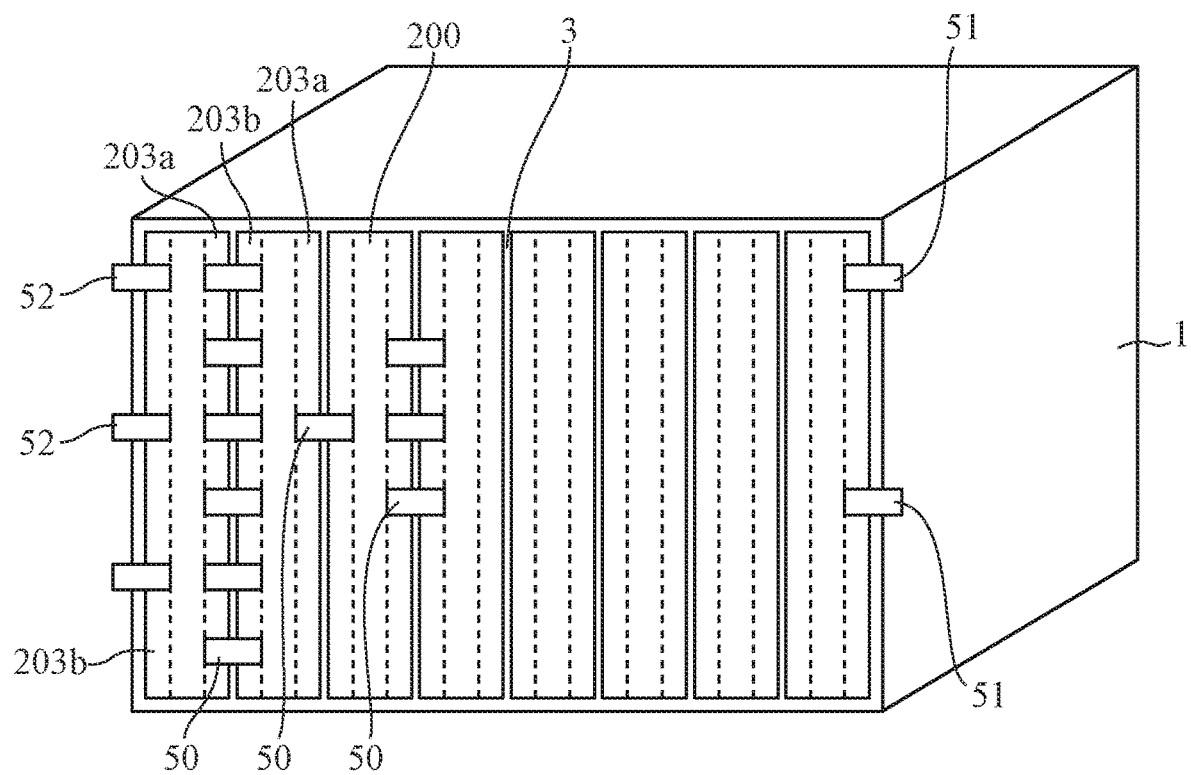
FIG. 5 is a perspective view of an essential part showing an electronic machine according to a second embodiment of the present invention.

A second embodiment of the present invention will be described below with reference to FIGS. 5 and 6. The second embodiment is different from the first embodiment in a structure of the front panel 22 of the electronic circuit board 2 and structures of the first bridge body 5, the second bridge body 7, the third bridge body constituting the conduction means, and is otherwise the same.

Therefore, differences from the first embodiment will be mainly described below. Note that, in the drawings, the same reference numerals indicate the same or corresponding portions.

Figure 6A:
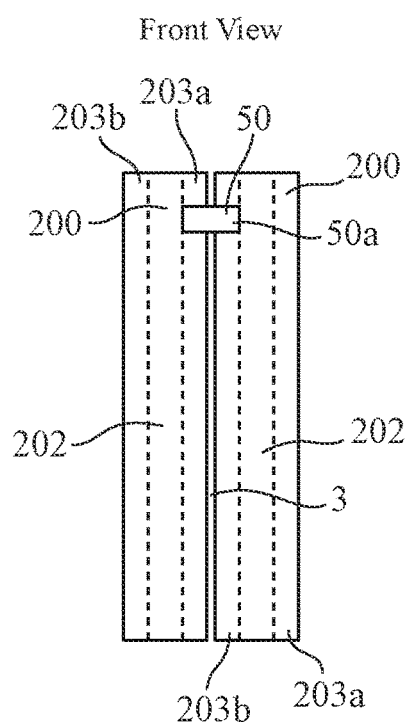
FIGS. 6A and 6B are a front view and a top view showing electronic circuit boards 200 adjacent to each other and a first bridge body 50 according to the second embodiment of the present invention.
Figure 6B:
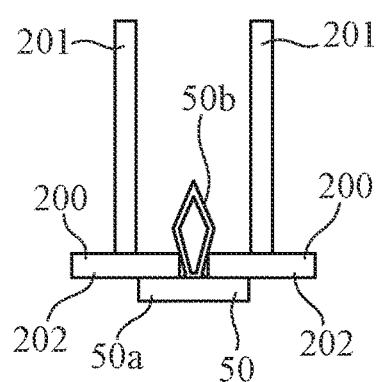

An electronic circuit board 200 is generally formed in a T shape as shown in FIG. 6. A leg of the T shape is a circuit board 201 on which electronic components are mounted. A head of the T shape attached to be connected to the circuit board 201 is a front panel 202.

The front panel 202 has a first conductive side portion 203a and a second conductive side portion 203b opposite to the first conductive side portion 203a, which are a pair of electrically conductive longitudinal sides. The first conductive side portion 203a and the second conductive side portion 203b are made of a conductor. In the second embodiment, the front panel 202 is made of metal, and the first conductive side portion 203a and the second conductive side portion 203b form parts of the front panel 202.

In the first embodiment, the holes 23a and the holes 23b are formed in the front panel 22, whereas in the second embodiment, holes are not formed in the front panel 202, and the other points are the same.

A first bridge body 50, a second bridge body 51, a third bridge body 52 that constitute conduction means exhibit the same function as the first bridge body 5, the second bridge body 7, the third bridge body described in the first embodiment, and are mounted on the basis of the same idea and method.

The first bridge body 50, the second bridge body 51, the third bridge body 52 has a spring-shaped retaining portion inserted through the gap 3 and serving as position deviation and retention.

In other words, as shown in FIG. 6, the first bridge body 50 includes: a metal bridge 50a in which one end contacts a first conductive side portion 203a of a front panel 202 in one electronic circuit board 200 of electronic circuit boards 200 adjacent to each other by applying pressure thereto, and in which another end contacts a second conductive side portion 203b of a front panel 202 in another electronic circuit board 200 of the electronic circuit boards 200 adjacent to each other by applying pressure thereto; and a retaining portion 50b made of a leaf spring, provided so as to protrude from the center of a back surface of the bridge 50a, inserted through the gap 3, and partially contacting back surfaces of the front panels 202 in the adjacent electronic circuit boards 200 by applying pressure thereto.

Note that the second bridge body 51 and the third bridge body 52 also have bridges and retaining portions as in the first bridge body 50.

Also in the second embodiment configured as described above, a power of an electronic machine is turned on, and radiation interfering wave measurement is performed. If there is a radiation interfering wave exceeding a regulation value, the first bridge body 50, the second bridge body 51, the third bridge body 52 is mounted by inserting the retaining portion so that the bridge spans the gap 3 for which a noise countermeasure is desired to be implemented. In other words, the first bridge body 50 is mounted between the front panels 202 adjacent to each other in a portion where a level of the radiation interfering wave is high, and the second bridge body 51, the third bridge body 52 is mounted between the front panel 202 and a right conductive portion 15, a left conductive portion 14 of a casing body 1 in a portion where a level of a radiation interfering wave is high.

In other words, in the first bridge body 50, only by inserting the retaining portion 50b into the gap 3, due to spring force of the retaining portion 50b, the bridge 50a contacts the first conductive side portion 203a of the front panel 202 and the second conductive side portion 203b of the front panel 202 by applying pressure thereto. Accordingly, the bridge 50a brings the front panels 202 of the electronic circuit boards 200 adjacent to each other into an electric conduction state.

Further, vertical position deviation in the gap 3 is also suppressed by the spring force of the retaining portion 50b.

Note that, also in each of the second bridge body 51 and the third bridge body 52, a retaining portion is inserted into the gap 3 in the same manner as the first bridge body 50, and a bridge brings the conductive side portion of the front panel 202 and the right conductive portion 15, and the conductive side portion of the front panel 202 and the left conductive portion 14 of the casing body 1 into an electric conduction state.

Therefore, in addition to the same effects as in the first embodiment, in the second embodiment, there are also effects that the first bridge body 50, the second bridge body 51, the third bridge body 52 can be easily mounted and can be adjusted to an arbitrary position.

Third Embodiment

Figure 7A:
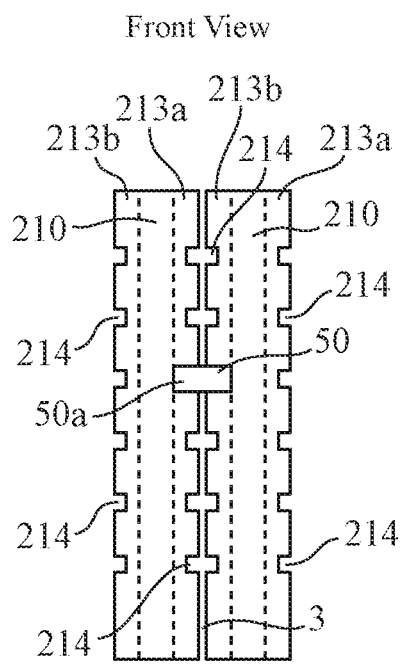
FIGS. 7A and 7B are a front view and a top view showing electronic circuit boards 210 adjacent to each other and a first bridge body 50 according to a third embodiment of the present invention.
Figure 7B:
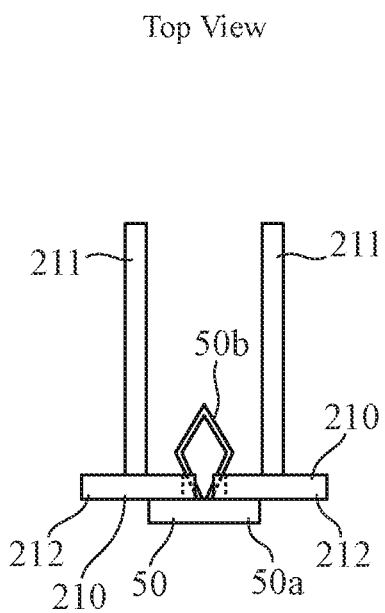

A third embodiment of the present invention will be described below with reference to FIG. 7. The third embodiment is different from the second embodiment in a structure of the front panel 202 of the electronic circuit board 20, and is otherwise the same.

Therefore, differences from the second embodiment will be mainly described below. Note that, in the drawings, the same reference numerals indicate the same or corresponding portions.

A front panel 212 of an electronic circuit board 210 has a plurality of recesses 214 formed on a first conductive side portion 213a and a second conductive side portion 213b from side surfaces along a longitudinal direction.

Note that, though not shown, a left conductive portion 14 and a right conductive portion 15 of a casing body 1 also have a plurality of recesses 214 formed from side surfaces along the longitudinal direction.

An insertion portion which also serves as a retaining portion for the first bridge body 50, the second bridge body 51, the third bridge body 52 is inserted into the recess 214. In the first bridge body 50, this insertion portion is indicated by 50b illustrated in FIG. 7.

In other words, in the first bridge body 50, the insertion portion 50b is inserted into selected recesses 214 of the plurality of facing recesses 214 between the front panels 212 of the electronic circuit boards 210 adjacent to each other, and a bridge 50a brings the front panels 212 of the electronic circuit boards 210 adjacent to each other into an electric conduction state.

Similarly to the first bridge body 50, also in each of the second bridge body 51 and the third bridge body 52, an insertion portion is inserted into selected recesses 214, and a bridge brings the conductive side portion of the front panel 212 and the right conductive portion 15, and the conductive side portion of the front panel 212 and the left conductive portion 14 of the casing body 1 into an electric conduction state.

Also in the third embodiment configured as described above, in addition to the effects similar to those of the second embodiment, an effect of being positioned and fixed by the recesses 214 is also obtained.

Fourth Embodiment

A fourth embodiment of the present invention will be described below with reference to FIG. 8. The fourth embodiment is different from the second embodiment in a structure of the front panel 202 of the electronic circuit board 200 and structures of the first bridge body 50, the second bridge body 51, the third bridge body 52 constituting the conduction means, and is otherwise the same.

Therefore, differences from the second embodiment will be mainly described below. Note that, in the drawings, the same reference numerals indicate the same or corresponding portions.

Figure 8A:
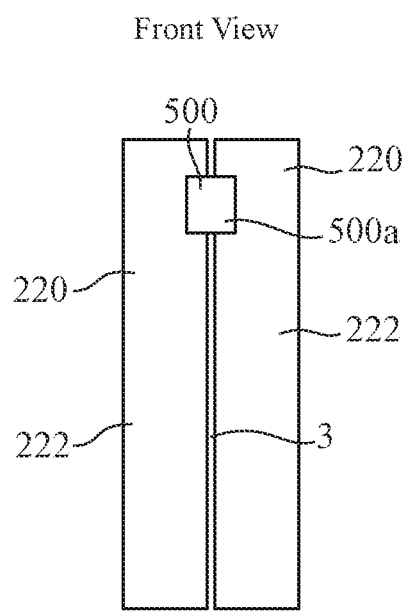
FIGS. 8A and 8B are a front view and a top view showing electronic circuit boards 220 adjacent to each other and a first bridge body 500 according to a fourth embodiment of the present invention.
Figure 8B:
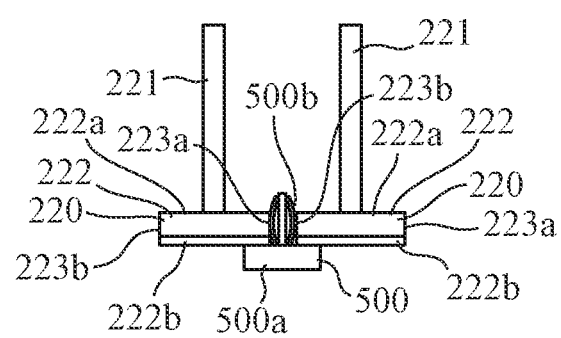

An electronic circuit board 220 is formed in a T shape as a whole as shown in FIG. 8. A leg of the T shape is a circuit board 221 on which electronic components are mounted. A head of the T shape attached to be connected to the circuit board 221 is a front panel 222.

The front panel 222 has a metal base 222a and a non-conductive member layer 222b in which a surface of the base 222a has been subjected to alumite treatment. A first conductive side portion 223a is a longitudinal side surface of the base 222a, and a second conductive side portion 223b is a longitudinal side surface of the base 222a opposite to the first conductive side portion 223a. The first conductive side portion 223a and the second conductive side portion 223b are parts of the metal base 222a of the front panel 222 and are electrically conducting conductors.

Note that, though the nonconductive member layer 222b is described as having been subjected to the alumite treatment, any nonconductive material may be used.

A first bridge body 500, a second bridge body, a third bridge body constituting conduction means exhibit the same function as the first bridge body 50, the second bridge body 51, and the third bridge body 52 described in the second embodiment, and are mounted on the basis of the same idea and method.

The first bridge body 500, the second bridge body, the third bridge body has an insertion portion inserted through the gap 3, serving as position deviation and retention, and a bridge.

In other words, as shown in FIG. 8, the first bridge body 500 includes: a head 500a; and a metal insertion portion 500b made of a leaf spring, provided so as to project from the center of a back surface of the head 500a, inserted through the gap 3, and partially contacting a first conductive side portion 223a of a front panel 222 in one electronic circuit board 220 of electronic circuit boards 220 adjacent to each other and a second conductive side portion 223b of a front panel 222 in another electronic circuit board 220 by applying pressure thereto.

The first bridge body 500 is positioned and retained by spring force of the insertion portion 500b only by inserting the insertion portion 500b into the gap 3, and the insertion portion 500b itself contacts the first conductive side portion 223a of the one front panel 222 and the second conductive side portion 223b of the other front panel 222 by applying pressure thereto, so that the first bridge body 500 functions as a bridge that brings the front panels 222 of the electronic circuit boards 220 adjacent to each other into an electric conduction state.

Note that, also in each of the second bridge body and the third bridge body, the insertion portion is inserted into the gap 3 in the same manner as the first bridge body 500, and the insertion portion reaches an electric conduction state between the conductive side portion of the front panel 222 and a right conductive portion 15, and between the conductive side portion of the front panel 222 and a left conductive portion 14 of a casing body 1.

Also in the fourth embodiment configured in this way, in addition to the same effects as the second embodiment, there is an effect that, even when the nonconductive member layer 222b is provided on the surface of the front panel 222 of the electronic circuit board 220, the front panels 222 of the electronic circuit boards 220 adjacent to each other can be easily brought into an electric conduction state.

Fifth Embodiment

A fifth embodiment of the present invention will be described below with reference to FIG. 9. The fifth embodiment is different from the fourth embodiment in structures of the first bridge body 500, the second bridge body, the third bridge body constituting the conduction means, and is otherwise the same.

Therefore, differences from the fourth embodiment will be mainly described below. Note that, in the drawings, the same reference numerals indicate the same or corresponding portions.

A first conductive side portion 223a of a front panel 222 of an electronic circuit board 220 is a longitudinal side of a back surface of a base 222a, and a second conductive side portion 223b is a longitudinal side of the back surface of the base 222a opposite to the first conductive side portion 223a. Also in the fifth embodiment, the first conductive side portion 223a and the second conductive side portion 223b are parts of the metal base 222a of the front panel 222 and are electrically conducting conductors.

A first bridge body 510, a second bridge body, a third bridge body constituting conduction means exhibit the same function as the first bridge body 500, the second bridge body, the third bridge body described in the fourth embodiment, and are mounted on the basis of the same idea and method.

The first bridge body 510, the second bridge body, the third bridge body has an insertion portion inserted through the gap 3, serving as position deviation and retention, and a bridge.

Figure 9:
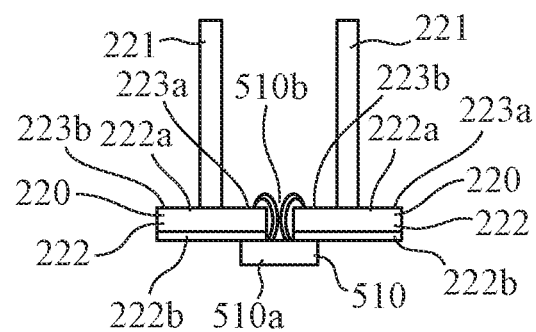
FIG. 9 is a front view and a top view showing electronic circuit boards 220 adjacent to each other and a first bridge body 500 according to a fifth embodiment of the present invention.

In other words, as shown in FIG. 9, the first bridge body 510 includes a head 510a and a metal insertion portion 510b formed of a leaf spring bent and pointed toward the head 510a. The insertion portion 510b is provided so as to project from the center of a back surface of the head 510a, is inserted through the gap 3, and a tip of the insertion portion 510b contacts a first conductive side portion 223a of a front panel 222 in one electronic circuit board 220 of electronic circuit boards 220 adjacent to each other and a second conductive side portion 223b of a front panel 222 in another electronic circuit board 220 by applying pressure thereto.

Note that, also in each of the second bridge body and the third bridge body, the insertion portion is inserted into the gap 3 in the same manner as the first bridge body 510, and the insertion portion reaches an electric conduction state between the conductive side portions of the front panel 222 and a right conductive portion 15 and a left conductive portion 14 of a casing body 1.

Also in the fifth embodiment configured as described above, in addition to the same effects as those of the fourth embodiment, accuracy of electrical conduction of the second bridge body and the third bridge body with the right conductive portion 15, the left conductive portion 14 of the casing body 1 is also improved.

It is to be noted that the present invention can freely combine embodiments, modify arbitrary components in the embodiments, or omit arbitrary components in the embodiments within the scope of the present invention.

REFERENCE SIGNS LIST

1: Casing body,
11: Electronic circuit board insertion port,
14: Left conductive portion, 15: Right conductive portion,
2, 200, 210, and 220: Electronic circuit boards,
21, 201, 211, and 221: Circuit boards,
22, 202, 212, and 222: Front panels,
22a, 203a, 213a, and 223a: First conductive side portions,
22b, 203b, 213b, and 223b: Second conductive side portions,
23a and 23b: Engagement portion consisting of internally-threaded holes,
214: Recess,
3: Gap,
5, 50, 500, and 510: First bridge body constituting conduction means (conduction device),
50a: Bridge,
50b: Retaining portion,
500a and 510a: Heads,
500b and 510b: Insertion portion,
7 and 51: Second bridge body constituting conduction means (conduction device),
52: Third bridge body constituting conduction means (conduction device).

The invention claimed is:

1. An electronic machine comprising:
a casing body having an electronic circuit board insertion port on one surface;
a plurality of electronic circuit boards each including: a circuit board, on which electronic components are mounted; and a front panel connected to the circuit board and having a first conductive side portion located in a longitudinal direction side portion and a second conductive side portion located opposite to the first conductive side portion, the plurality of electronic circuit boards being inserted in parallel through the electronic circuit board insertion port of the casing body with gaps between the front panels adjacent to each other; and
a conduction device having a first bridge body, and in electronic circuit boards adjacent to each other in the plurality of electronic circuit boards, the first bridge body electrically conducting the first conductive side portion of the front panel in one electronic circuit board of the electronic circuit boards adjacent to each other and the second conductive side portion of the front panel in another electronic circuit board that faces the first conductive side portion via a gap,
wherein each of the plurality of electronic circuit boards has a plurality of engagement portions on the first conductive side portion and the second conductive side portion along the longitudinal direction, the conduction means has a plurality of first bridge bodies, and each of the first bridge bodies is a conductive plate having: one end screwed to a selected engagement portion of a plurality of engagement portions provided on the first conductive side portion of the front panel in one electronic circuit board of electronic circuit boards adjacent to each other and another end screwed to a selected engagement portion of a plurality of engagement portions provided on the second conductive side portion of the front panel in another electronic circuit board.

2. The electronic machine according to claim 1, wherein the casing body has conductive portions on both sides of the electronic circuit board insertion port, and
the conduction device has a second bridge body for electrically conducting one conductive portion of the casing body and the first conductive side portion of the front panel in an electronic circuit board that faces the one conductive portion via a gap and a third bridge body for electrically conducting another conductive portion of the casing body and the second conductive side portion of the front panel in an electronic circuit board that faces the other conductive portion via a gap.

3. The electronic machine according to claim 1, wherein in the plurality of electronic circuit boards, the plurality of engagement portions provided on the first conductive side portion and the second conductive side portion are holes.

4. The electronic machine according to claim 3, wherein in the plurality of electronic circuit boards, the holes serving as the plurality of engagement portions provided on the first conductive side portion and the second conductive side portion are internally threaded.

5. The electronic machine according to claim 1, wherein the conduction device has a plurality of first bridge bodies, and
each of the first bridge bodies has a spring-shaped retaining portion inserted through a gap located between electronic circuit boards adjacent to each other and serving as position deviation and retention.

6. The electronic machine according to claim 2, wherein in the plurality of electronic circuit boards, the plurality of engagement portions provided on the first conductive side portion and the second conductive side portion are holes.

7. The electronic machine according to claim 6, wherein in the plurality of electronic circuit boards, the holes serving as the plurality of engagement portions provided on the first conductive side portion and the second conductive side portion are internally threaded.

8. The electronic machine according to claim 2, wherein the conduction device has a plurality of first bridge bodies, and
each of the first bridge bodies has a spring-shaped retaining portion inserted through a gap located between electronic circuit boards adjacent to each other and serving as position deviation and retention.

9. An electronic machine comprising:
a casing body having an electronic circuit board insertion port on one surface;
a plurality of electronic circuit boards each including: a circuit board, on which electronic components are mounted; and a front panel connected to the circuit board and having a first conductive side portion located in a longitudinal direction side portion and a second conductive side portion located opposite to the first conductive side portion, the plurality of electronic circuit boards being inserted in parallel through the electronic circuit board insertion port of the casing body with gaps between the front panels adjacent to each other; and
conduction means having a first bridge body, and in electronic circuit boards adjacent to each other in the plurality of electronic circuit boards, the first bridge body electrically conducting the first conductive side portion of the front panel in one electronic circuit board of the electronic circuit boards adjacent to each other and the second conductive side portion of the front panel in another electronic circuit board that faces the first conductive side portion via a gap,
wherein the conduction means has a plurality of first bridge bodies, and
each of the first bridge bodies has a spring-shaped insertion portion inserted into a gap located between electronic circuit boards adjacent to each other and for applying pressure to facing side surfaces of the electronic circuit boards adjacent to each other, wherein a surface of the front panel of each of the plurality of electronic circuit boards is made of a nonconductive member, the first conductive side portion and the second conductive side portion are longitudinal side surfaces, and the insertion portion of each of the plurality of first bridge bodies is made of a conductive member.

10. The electronic machine according to claim 9, wherein the casing body has conductive portions on both sides of the electronic circuit board insertion port, and
the conduction means has a second bridge body for electrically conducting one conductive portion of the casing body and the first conductive side portion of the front panel in an electronic circuit board that faces the one conductive portion via a gap and a third bridge body for electrically conducting another conductive portion of the casing body and the second conductive side portion of the front panel in an electronic circuit board that faces the other conductive portion via a gap.

* * * * *